(12) United States Patent
Rozario et al.

(10) Patent No.: US 7,960,998 B2
(45) Date of Patent: Jun. 14, 2011

(54) ELECTRICAL TEST STRUCTURE AND METHOD FOR CHARACTERIZATION OF DEEP TRENCH SIDEWALL RELIABILITY

(75) Inventors: Lisa V. Rozario, San Jose, CA (US); Andy Strachan, Santa Clara, CA (US); Richard Orr, San Mateo, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 231 days.

(21) Appl. No.: 12/212,289

(22) Filed: Sep. 17, 2008

(65) Prior Publication Data
US 2009/0206865 A1 Aug. 20, 2009

Related U.S. Application Data

(60) Provisional application No. 61/029,026, filed on Feb. 15, 2008.

(51) Int. Cl.
*G01R 31/02* (2006.01)
(52) U.S. Cl. .................................. 324/762.09
(58) Field of Classification Search .......... 324/765–769; 438/14–18; 257/48
See application file for complete search history.

(56) References Cited

U.S. PATENT DOCUMENTS

| 6,137,152 A * | 10/2000 | Wu | 257/510 |
| 6,365,952 B1 * | 4/2002 | Akram | 257/510 |
| 7,298,159 B1 | 11/2007 | Rozario et al. | 324/765 |
| 7,348,596 B2 * | 3/2008 | Lin | 257/48 |
| 2005/0064678 A1 * | 3/2005 | Dudek et al. | 438/424 |

* cited by examiner

*Primary Examiner* — Ha Tran T Nguyen
*Assistant Examiner* — Arleen M Vazquez
(74) *Attorney, Agent, or Firm* — Dergosits & Noah LLP

(57) ABSTRACT

A test structure and testing method are provided for characterizing the time-dependent drift in the parasitic PFET leakage current that flows along the sidewall of a deep trench isolation structure from the P-type active area to the P-type substrate in a semiconductor integrated circuit structure. The capacitive coupling characteristics of the deep trench isolation structure are used to control the electrical "bias" of the deep trench structure through the use of a large auxiliary trench mesh network that is formed as part of the deep trench structure. The trench mesh network can be placed adjacent to a Vdd ring or a ground ring and then, by using a ratioed capacitive voltage dividing network, the electrical potential at the trench can be controlled.

8 Claims, 5 Drawing Sheets

BIASING SCHEME:

| BIAS AT "P-TYPE" REGION | BIAS AT "N-COLL/NBL" REGION | BIAS AT "P-SUBSTRATE" REGION | MEASURE AT "P-TYPE" TERMINAL |
|---|---|---|---|
| VBIAS | VBIAS | 0.0 | "IPN" |

ELECTRICAL TEST STRUCTURE AND METHOD FOR CHARACTERIZATION OF DEEP TRENCH SIDEWALL RELIABILITY

PRIORITY CLAIM

This patent application claims the priority filing benefit of U.S. Provisional Application No. 61/029,026, filed on Feb. 15, 2008, titled "Electrical Test Structure and Method for Characterization of Poly Filled Deep Trench Sidewall Reliability." Provisional Application No. 61/029,026 is hereby incorporated by reference herein in its entirety.

FIELD OF THE INVENTION

The present invention relates to deep trench isolation structures and, in particular, to an electrical test structure and a testing method that utilizes a capacitively coupled auxiliary trench mesh at the electrical node of the deep trench for characterizing the time dependent drift in parasitic PFET leakage current that flows along the trench sidewall from the P-type active area to the P-substrate.

DISCUSSION OF THE RELATED ART

As discussed in commonly-assigned U.S. Pat. No. 7,298,159, which issued to Rozario et al. on Nov. 20, 2007, deep trench isolation structures are well known in the semiconductor industry for use in electrically isolating adjacent regions of a semiconductor substrate, epitaxial layer or well region from each other. The deep trench structure is commonly formed by etching a deep vertical trench in the semiconductor substrate or through an epitaxial layer into the substrate. Typically, the trench is lined with silicon oxide and then filled with polysilicon.

FIG. 1 shows a cross-section of a semiconductor structure 100 that utilizes poly filled deep trench isolation. As shown in FIG. 1, semiconductor structure 100 is formed in a P-type semiconductor substrate 110 and includes an N+ buried layer (NBL) 112 and an N-well 114 that is formed to extend from the upper surface of the semiconductor substrate 100 down to the N+ buried layer 112.

As further shown in FIG. 1, the semiconductor structure 100 also includes a deep trench isolation structure 118 that electrically isolates the N+ buried layer 112 and the N-well region 114 from a lateral substrate (i.e., P-type) region 116. The deep trench isolation structure 118 includes a vertical trench 120 that extends down from the top surface 136 of the substrate 110 through the N+ buried layer 112 into a region of the substrate 110 below the buried layer 112; it also includes a layer of trench sidewall silicon oxide liner 122 that contacts the N-well 114, the buried layer 112 and the substrate 110 and a polysilicon region 124 that fills the remainder of the trench 120 inside the sidewall liner oxide 122. FIG. 1 shows the poly fill 124 insulated from the surface of the structure 100 by silicon oxide.

The FIG. 1 semiconductor structure 100 also includes a P-type region 130 that is formed in the N-well 114, an N+ region 132 formed in the N-well 114 to be spaced-apart from the P-type region 130, and a P+ region 134 formed in the substrate 110. As will be recognized by those skilled in the art, the semiconductor structure 100 can represent the elements of a number of integrated circuit device structures such as, for example, an MOS transistor, a bipolar transistor, or a resistor. Those skilled in the art will also appreciate that the FIG. 1 semiconductor structure 100 may be fabricated using any number of well known integrated circuit processing techniques.

As further discussed in U.S. Pat. No. 7,298,159, the FIG. 1 structure 100 is subject to significant trench leakage current that results from the deep trench isolation structure 118. Polysilicon fill region 124 has a potential that is defined by the voltage on the regions that are adjacent to the deep trench structure 118 and the capacitive coupling characteristics of the liner oxide layer 122. In some cases, this potential can be sufficient to form a parasitic PFET channel region adjacent to the sidewall of the deep trench isolation structure 118, which, in turn, provides a pathway for trench leakage current IL (FIG. 1) to flow from the P-type region 130 to the P-type substrate 110, or from the P-substrate 110 to the P-type region 130, depending upon the relative voltages on these regions. The trench leakage current IL has an adverse effect on the performance of the circuit structures.

Various techniques are available for reducing the trench leakage current IL. Furthermore, techniques are also available for testing the efficacy of the leakage current reduction techniques to ensure that the trench leakage current IL falls within specified limits. One such technique is described in detail in above-cited U.S. Pat. No. 7,298,159.

With continuing reference to FIG. 1, in accordance with the current leakage testing method disclosed in the '159 patent, test voltages are placed on the P-type region 130, the N-well 114, N+ region 132 and the lateral region 116 to reverse bias the junction between P-type region 130 and the well region 114. The current is then measured at the P-type region and compared against the specified limits. If the current measurement establishes that the specified limits are met, then the device passes the test. If the specified limits are not met, then further leakage current reduction techniques are applied to the circuit design and the current measuring test is repeated. This process continues iteratively until the specified limits are met.

U.S. Pat. No. 7,298,159 is hereby incorporated by reference herein in its entirety to provide background information regarding the present invention.

The leakage current measurement techniques disclosed in U.S. Pat. No. 7,298,159 help to differentiate the origin of the leakage current. A bipolar assisted leakage (from a parasitic npn, pnp formation deep in the NBL/Psubstrate) can be detected from reduction of the leakage in reverse biasing the junction. However, a MOS channel type leakage originated from a floating trench, acting as a gate, from the active area to the substrate does not respond to a trench floating condition. It would be desirable to have techniques available for concentrating on MOS originated leakage.

SUMMARY OF THE INVENTION

The present invention provides a test structure and testing method for characterization of the time-dependent drift in the parasitic PFET leakage current that flows along the sidewall of the deep trench structure from the P-type active area to the P-type substrate. When the deep trench is at "near ground" potential (i.e., not floating to optimum natural voltage), the lateral electric field in the vicinity of the P-type substrate, the N+ buried vertical isolation and the deep trench sidewall becomes high. At worst case, an impact ionization occurs due to the breakdown of the NBL/P-substrate junction. This leads to an interface trap generation process through hot hole injection. The test structure and method of the invention characterizes this time dependent drift process with the natural floating condition of the trench, that is, without an electrical contact to the deep trench structure.

As discussed above, a deep trench isolation structure is basically a capacitive coupling network between adjacent layers of an integrated circuit device. The present invention utilizes this characteristic of deep trench isolation technology to control the electrical "bias" of the deep trench structure through the use of a large auxiliary trench mesh network that is formed as part of the deep trench structure and that is sized to maintain the trench sidewall leakage current within specified limits. The trench mesh network can be place adjacent to a Vdd ring or a ground ring and then, by using a ratioed capacitive voltage dividing network, the electrical potential at the trench can be controlled. This method eliminates the use of a trench contact. Thus, an important aspect of the present invention lies in the fact that different electrical characteristics of the deep trench structure can be measured without directly electrically contacting the trench.

The features and advantages of the various aspects of the present invention will be more fully understood and appreciated upon consideration of the following detailed description of the invention and the accompanying drawings, which set forth an illustrative embodiment in which the concepts of the invention are utilized.

DETAILED DESCRIPTION OF THE INVENTION

Figure 1:
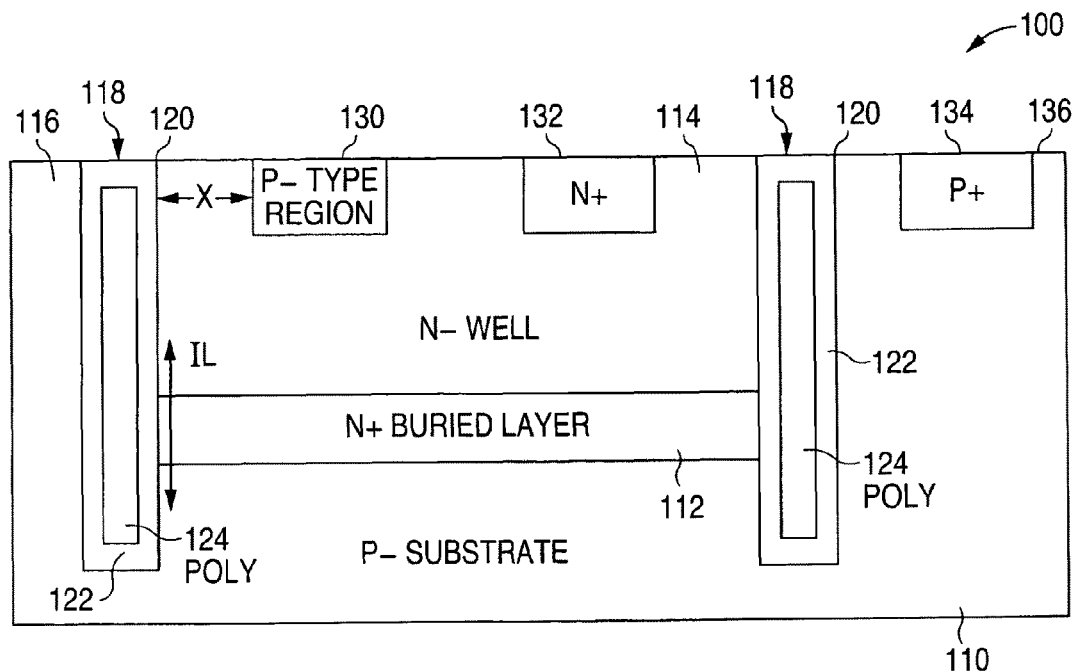
FIG. 1 is a cross section drawing illustrating deep trench isolation in a semiconductor structure.

As stated above, the present invention is directed to test structures and test methods for characterizing the time-dependent drift in parasitic PFET leakage current that flows along the trench sidewall from a P-type active diffusion region to the P-substrate in a deep trench isolation technology. This sidewall leakage current is a strong function of the natural voltage to which the trench floats. The floating status is determined by the coupling capacitance to adjacent layers. Thus, the floating mechanics is dependent upon the trench liner oxide thickness and the amount of "extra" trench propagation that is connected to that node. Since the trench floats to a fraction of the applied voltage (Vdd), depending upon the ratio of the capacitive dividing network between active region, ground and trench oxide, the floating status is also determined by the supply voltage. As discussed in greater detail below, the invention relies on the use the use of an auxiliary trench mesh structure at the electrical node of the actual poly filled trench to act as a capacitive dividing network to pull the trench node to any voltage. This voltage is capacitively coupled from the trench mesh adjacent layers, e.g., a ground ring or a Vdd ring.

The basic test die structure includes a reference structure and a plurality additional reference structures with different linear lengths of auxiliary trench added (e.g., 100 $\mu m^2$/1 $\mu m$ wide=100 $\mu m$ length, 7000 $\mu m$, 30,000 $\mu m$, etc.). With the added extra linear auxiliary trench, the trench capacitor becomes a relatively large area; therefore, the voltage dividing is different between the basic reference structure and each of the plurality of additional reference structures formed on the test die once the active area is biased to a test potential.

The ground ring and Vdd ring features provide variations on the just-described basic structures. A ground ring or Vdd ring around the basic structures provides a capacitor dividing network and a bias source (gnd, Vdd). It is very common in many integrated circuit applications to use a ground ring or Vdd ring for latchup protection around a trench; this factor affects the trench floating conditions.

Although the invention is described below in the context of sidewall leakage current between a P-type active area and a P-type substrate, those skilled in the art will appreciate that the concepts of the invention are generally applicable for determining the inversion threshold of a buried layer that is bounded by regions of opposite polarity in a deep trench isolated technology, i.e., both P-active/NBL/P-substrate and N-active/PBL/N-substrate.

While the concepts of the present invention will be described in detail below with reference to the FIG. 1 semiconductor structure 100, those skilled in the art will also appreciate that the scope of the invention is not limited to this particular illustrative embodiment.

As discussed in greater detail below, a basic leakage current test structure in accordance with the concepts of the present invention includes a plurality of test structures formed on a single integrated circuit die. Each test structure includes a "detector" of parasitic leakage and an auxiliary trench structure of different size from the other test structures that is added to the basic reference test structure and determines the bias of the trench for that particular test structure by a coupling capacitive effect. The trench can be poly filled or oxide filled, i.e., an oxide capacitor. As will appreciated by those skilled in the art, the trench, whether poly filled or oxide filled, is a capacitor. Although the CV data characteristics shape is different (MOS or oxide), since capacitive coupling is present, the concepts of the invention work for both cases. Adding an auxiliary trench mesh (oxide filled) and providing a ground ring ensures that the trench is at ground potential.

The detector of the test structure can be any device that has a p+ active region, NBL isolation, and p-substrate combination with the poly filled deep trench as the lateral isolation scheme, as exemplified by the FIG. 1 semiconductor structure 100. Depending on the coupling capacitance between the poly filled deep trench isolation structure 118 and the adjacent p-type region 130, the trench floats to a certain potential. In the worst case condition, when the trench cannot float at all (i.e., remains grounded), then the lateral electric field terminating in the vicinity of the N-buried layer, P-substrate and trench can become high and lead to high parasitic leakage current resulting from the N-buried layer to P-substrate diode reverse breakdown.

As stated above, the auxiliary trench structure is a trench mesh/concentric trench ring structure with varying dimensions and of varying constructions for different on-chip test structures. The amount of "extra" trench connected to the detector determines the trench floating voltage. In the preferred embodiment, the auxiliary trench is provided as a linear length of trench, which is an efficient way of packing trench within a minimum amount of die space. Thus, the trench bias can be naturally adjusted using a certain amount of auxiliary trench or coupling rings (N-type or P-type). The potential of a surrounding P-ring (ground ring) or N-type (Vdd ring) around the auxiliary trench will also affect the floating status of the trench through the coupling capacitive affect.

Observation of the nature of the change in sidewall leakage current with temperature verifies that this leakage is not bipolar in nature. The fact that the leakage is of purely "MOS" origin explains why the use of an auxiliary trench of varying size can affect the leakage.

Figure 2A:
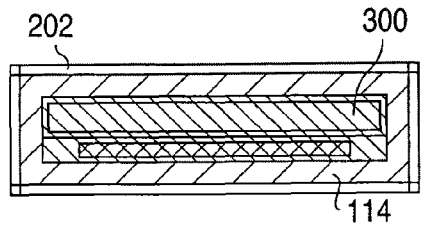
FIGS. 2A-2D are top view drawings illustrating various aspects of the layout of a trench sidewall leakage current test structure in accordance with the concepts of the present invention.
Figure 2C:
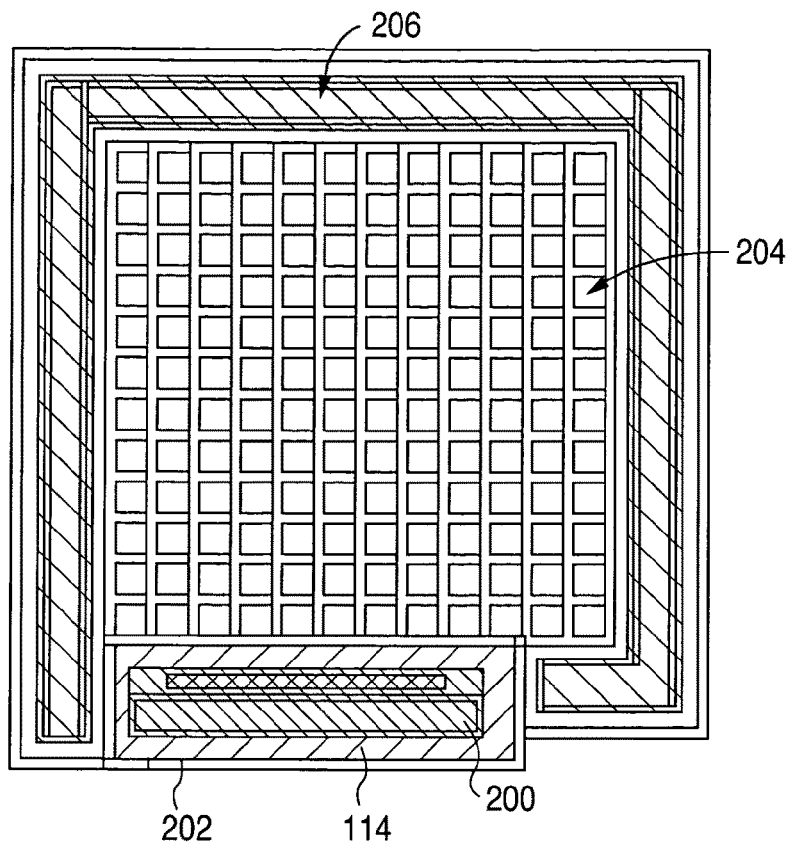
Figure 2B:
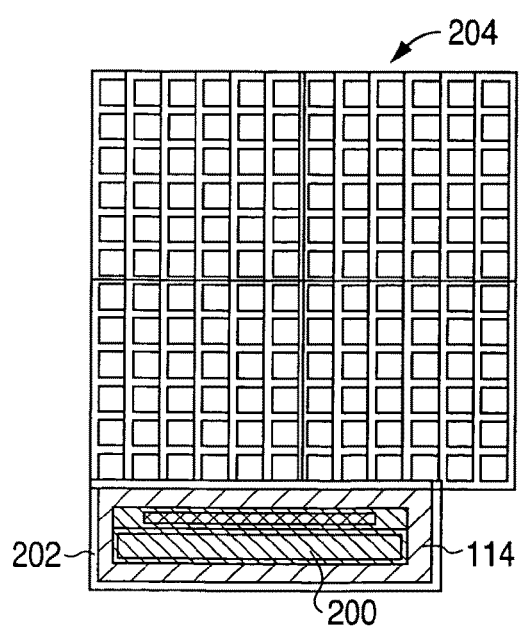
Figure 2D:
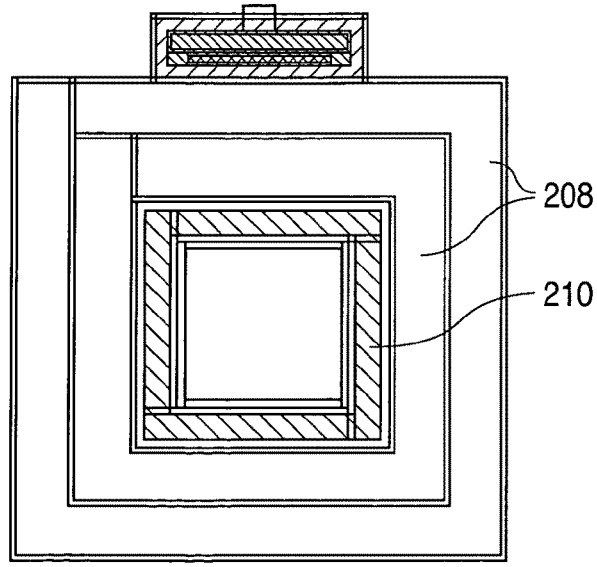

A simple example of the concepts of the invention will now be discussed with reference to FIGS. 2A-2D. FIG. 2A shows a basic P+ resistor 200 (detector) formed in the N-well 114 of the FIG. 1 semiconductor structure 100 and separated from the poly-filled deep trench isolation structure 118 by sidewall liner oxide 202. FIG. 2B shows the basic P+ resistor 200 together with a 12×12 trench auxiliary trench mesh structure 204 formed in the lateral region 116 of the semiconductor structure 100 as part of the deep trench isolation structure 118. The geometry of the individual elements of the trench mesh are preferably defined in accordance with the minimum design rules on the technology in use. FIG. 2C shows the FIG. 2B structure, that is, P+ resistor 200 and adjacent 12×12 auxiliary trench mesh structure 204 surrounded by a spaced apart P+ ground ring 206 formed in the lateral region 116. FIG. 4D shows the basic P+ resistor 200 and concentric rings 208 of interconnected auxiliary trench mesh surrounding an interior N-type ring 210; the N-ring 210 can either be floated or biased to Vdd. Thus, FIGS. 2A-2D define an example of one set of leakage current test devices. In accordance with the concepts of the present invention, a plurality of different sets such test devices, each including the basic P+ resistor structure, but each having an auxiliary trench mesh of different area associated therewith, is also formed on the same IC die as the leakage current test set defined by the structures shown in FIGS. 2A-2D. As will be appreciated by those skilled in the art, although the auxiliary trench structure in FIGS. 2A-2D is shown as a 12×12 rectangle, the layout of the auxiliary trench will depend upon the architecture of the integrated circuit design into which it will be incorporated. Although the auxiliary trench structure can be any shape, it is believed that, in most cases, a linear design of fixed width will be the most efficient.

As discussed above, when the structure with a large auxiliary trench mesh is held at constant DC bias for a period of time, a time dependent shift in leakage current is observed. This is a permanent shift and strongly depends on the trench sidewall oxide thickness, the applied DC bias and the trench floating bias. The DC bias is to hold the P+ active region 130 and the N-buried layer 112 to high voltage, the P-substrate 110 to ground potential, and then measuring the leakage Ipn of P+ active terminal 130. During the "stress cycle", Vbias is higher than the use Vdd to accelerate the hot carrier injection mechanism. During the "measuring cycle" the current Ipn is measure as a function of time at the use Vdd. This biasing scheme, which is disclosed in above-cited U.S. Pat. No. 7,298,159, is summarized in FIG. 3. The difference is that the test measurements are not iterative as required in the technique disclosed in the '159 patent; rather. Since all of the test sets are on the same chip, the may be performed at the same time to determine optimum design conditions.

Figures 3, 4:
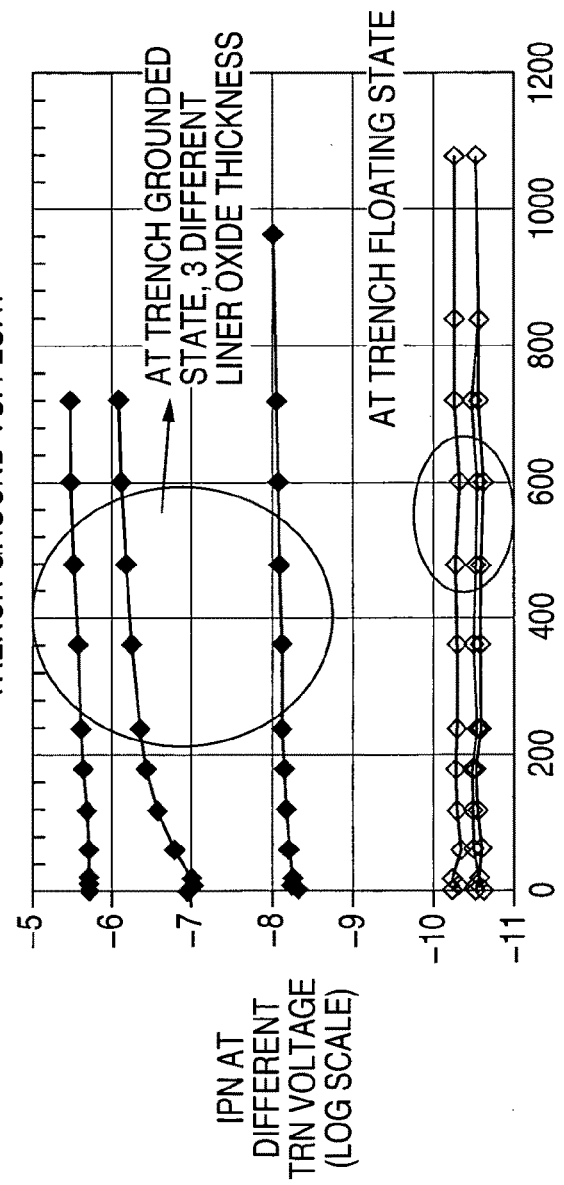
FIG. 3 provides a table listing bias conditions for a reliability testing method in accordance with the concepts of the present invention.
FIG. 4 is graph showing trench sidewall leakage drift with time depending upon trench floating status and various trench sidewall liner oxide thicknesses.

FIG. 4 shows trench sidewall leakage drift with time depending upon trench floating status for three different liner oxide thicknesses. As shown in FIG. 4, as the trench floating condition is determined by the state of the capacitive coupling network provided by the trench, so it is understood that the thickness of the liner oxide will determine the CV characteristics of the trench. The thicker the liner oxide, the smaller the capacitive coupling and the higher the threshold of the leakage current effect. One of the problems associated with growing thicker liner oxides is that the additional thermal work affects the diffusion of the deep layers in the IC device and, thus, affects junction profiles. Also, thicker liner oxide causes more stress propagation and defect propagation in adjacent layers.

More specifically, FIG. 4 shows the long time cumulative stress in seconds on the X axis versus the characteristic current drift in log scale on the Y axis for three different liner oxides at different floating conditions. In this case, the floating condition was exactly controlled by using a trench contact, although in an actual production IC device, this effect is coming from extra trench propagation and a bias dividing network formally naturally. As the trench is grounded, assume 0 volts, and for an applied voltage Vdd of V1 volts, the field at the NBL/Psubstrate/Trench interface is (V1−0)/d, where d is the thickness of the liner oxide. However, if the trench is allowed to float to, say 8 volts optimum, then the electric field is (V1−8)/d, so the critical electric field for avalanche BV is reached at the trench grounded condition first, and obviously for thinner liner oxide earlier. This is, in fact the observed effect, a parasitic hot carrier injection in the drain/body junction of the vertical parasitic PMOS device along the trench sidewall (formed by the P+ active/NBL/Psubstrate with the trench liner as the gate; see FIG. 1). As charges are injected into the liner oxide as part of the impact ionization, the threshold of this parasitic MOS device is changing, and a changing rate of degradation of the current is observed. If the trench is allowed to float, then the critical electric field is not yet reached, the current is small, and no degradation is observed.

Figure 5:
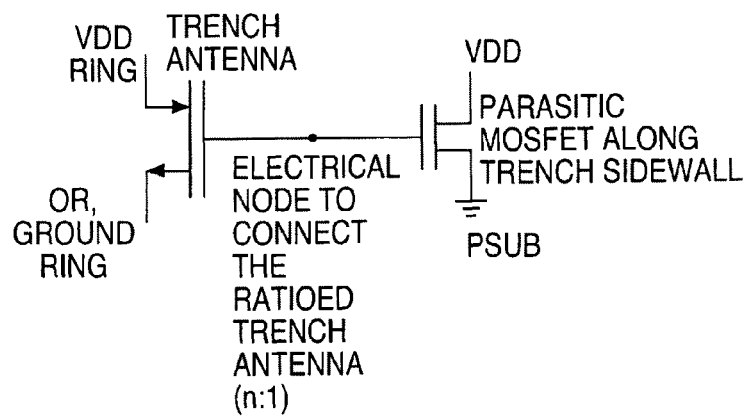
FIG. 5 is a schematic representation of a trench sidewall leakage current test structure in accordance with the concepts of the present invention.

FIG. 5 provides a schematic representation of a test structure in accordance with the invention. The parasitic MOSFET "detector" of the structure, formed along the trench sidewall, includes a P-type region (Vdd) and the P-substrate with the N-type buried layer providing the parasitic device channel. The trench antenna is coupled either to a Vdd guard ring or to a ground ring. The bias on the antenna drives the leakage current through the parasitic MOSFET.

Figure 6:
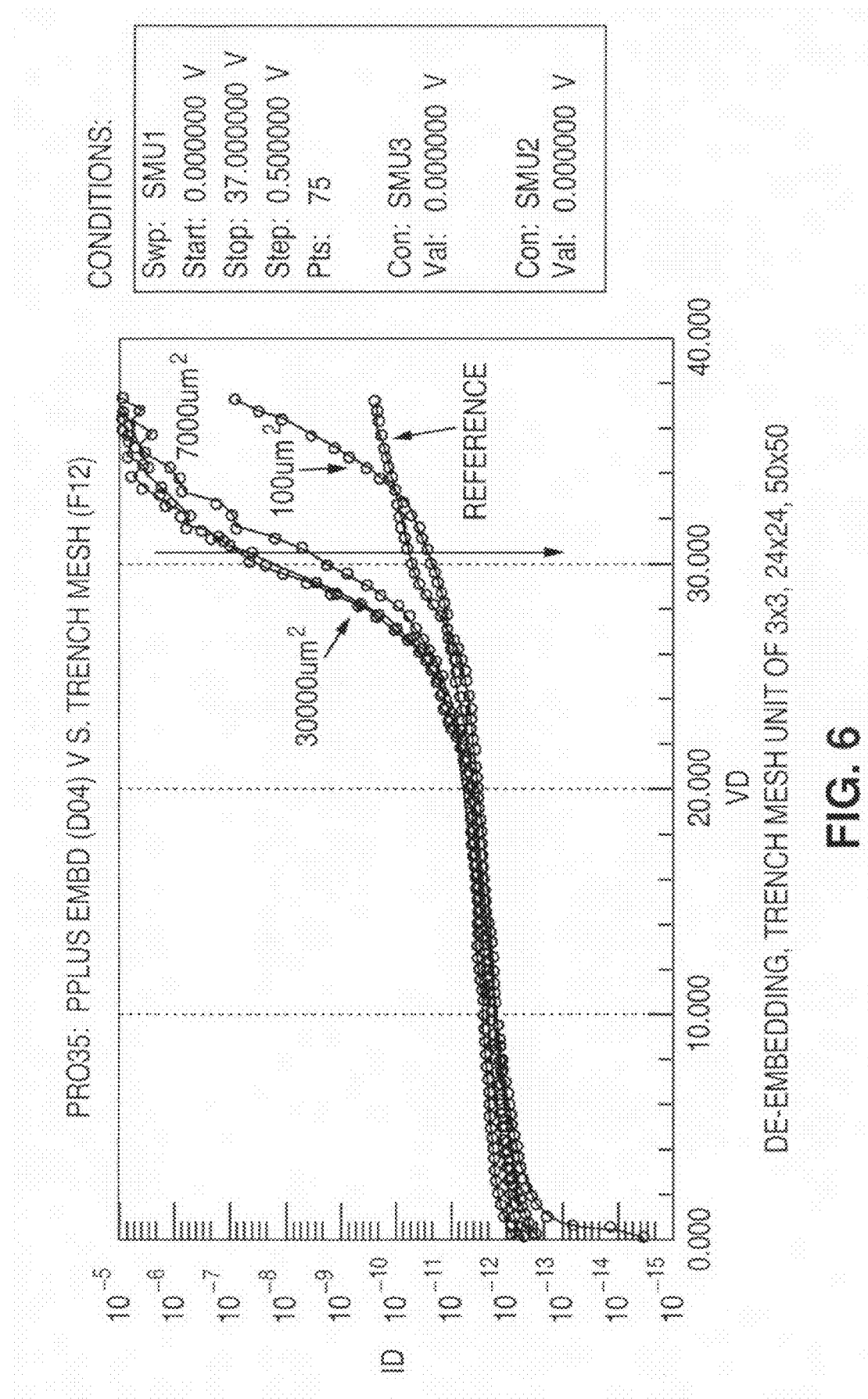
FIG. 6 is a graph illustrating the effects of trench propagation area on the free floating status and leakage current of a various size trench mesh structures in accordance with the concepts of the present invention.

FIG. 6 shows the effect of trench propagation area. The trench area of propagation affects free floating status and leakage; with larger trench mesh, the leakage gets higher at a particular voltage. That is, in FIG. 6, the effect of the trench floating condition can be seen. A free floating trench, e.g., for the 24V process at 8V, the electric filed at the trench/NBL/Psub interface is (24−8)/650 Å liner oxide thickness. When the auxiliary trench structure is added, the trench capacitor becomes large, so it cannot float to optimum. Assume that it floats at $V, so the field is (24−4)/650; in these conditions, the drain/body junction of the parasitic vertical PMOS device is closer to the avalanche BV field. If the auxiliary trench becomes very large, then the trench is at 0V and leakage is very large at any measured voltage, since the field is higher. When a ground ring is used around the trench network, then coupling is coming from the active 24V and the ground ring in a capacitive coupling configuration. Therefore, this is worse than incorporating a Vdd ring.

Figure 7:
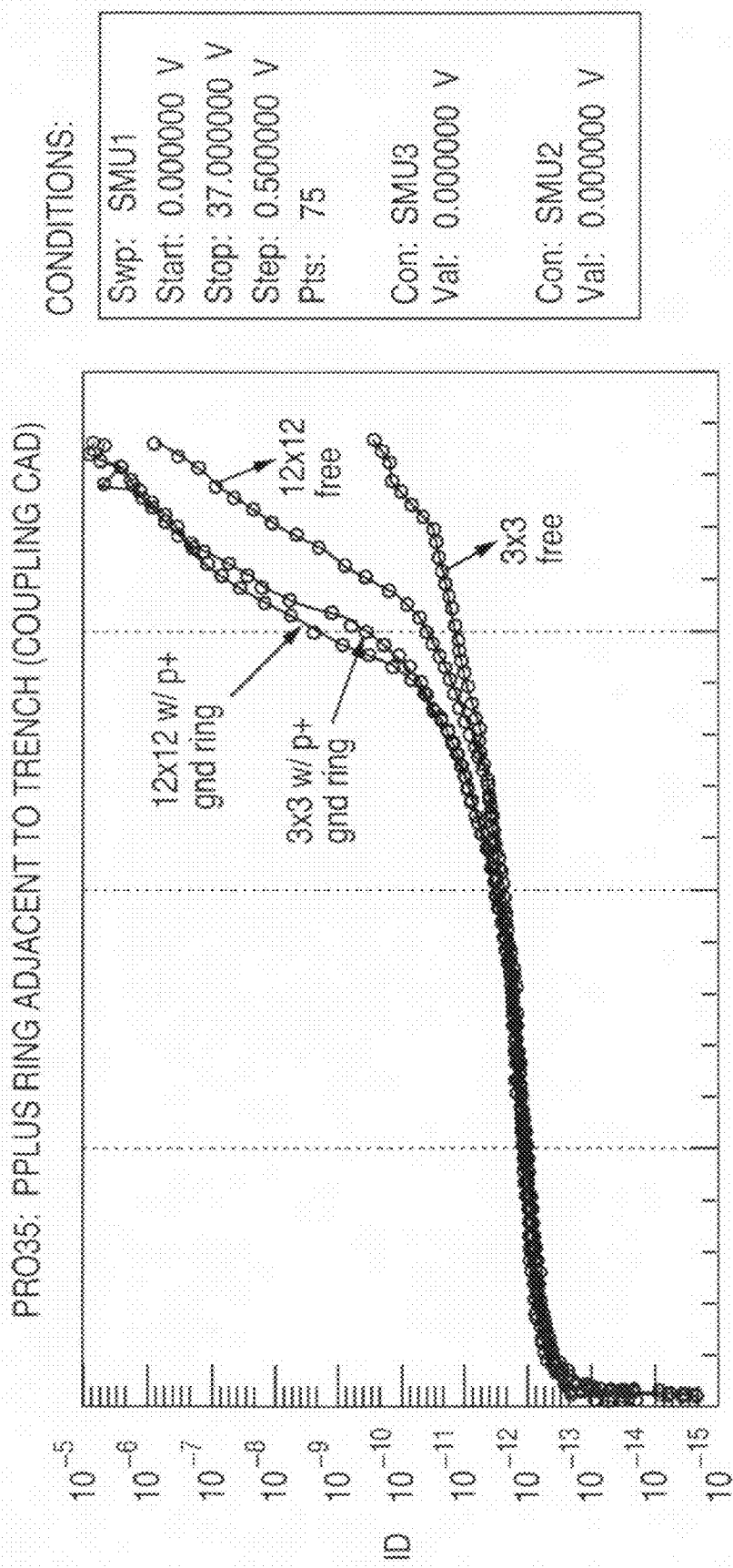
FIG. 7 is a graph illustrating the effect of a trench adjacent capacitive coupling network in accordance with the invention for various sizes of trench mesh versus a grounded P+ ring around the trench.

FIG. 7 shows the effect of trench adjacent capacitive coupling network for trench mesh 3×3, 24×24 free float versus a grounded P+ ring around the trench.

The sidewall leakage current is arising from the high transverse electric field generated at the trench sidewall parasitic MOSFET's Drain/Body end (−NBL/Psubstrate junction). The trench floating bias is not a forced bias through a trench contact, but set by capacitive coupling of the trench to adjacent regions. This determines with natural surrounding (doping, epi thickness, liner thickness, applied Vdd) of the deep trench, what would be the long term reliability drift of the sidewall. Therefore, it suggests that natural long term reliability of the trench sidewall. The worst case is determined by a very large trench antenna, or a ground ring where the trench is at near ground potential, and the degradation rate is very fast.

As discussed above, the present invention provides test systems and test methods for characterizing the parasitic PFET leakage current that flows along the trench sidewall for P=composite to P-substrate in a poly or oxide filled trench isolation process, while suppressing the parasitic bipolar component of the leakage. For an applied Vdd, a given coupling capacitance of adjacent layers to a trench and a given thickness of trench liner oxide, the trench can float to a certain potential, usually a fraction of Vdd. The natural voltage to which the trench floats determine the parasitic "Ipn" leakage current around it. For the worst case, when the trench cannot float at all, i.e., remains grounded, then even for the same Vdd applied, the lateral electric field in the vicinity of the P-substrate, N buried layer and trench intersection becomes very high; this leads to a very high parasitic current resulting form the N buried layer to P-substrate diode breakdown. This is the equivalent of the drain-bulk diode breakdown of the parasitic FET. This high leakage current is responsible for a large "dark" current in product production.

This leakage current is different from the bipolar component of parasitics that can arise from an internal parasitic drop between a "P" and "N" type layer in a lightly doped wide epi region. The method for suppressing the parasitic in progress is also different. While the parasitic FET current can be lowered by thickening the trench oxide as discussed above, the bipolar component can be controlled by using a high energy deep sub-collector implant or deeper drive.

The current test method puts the P+, N+ composite region to high Vdd, the P-substrate to ground, and allows the trench to float to its natural potential. At low Vdd, usually the leakage observed is low. However, for a given thickness of trench liner oxide, a certain layout scheme (coupling capacitance change), and a certain bias condition around the vicinity of the trench isolation (e.g., having a large ground ring around the device) can change the trench floating condition and lead to a breakdown of the NBL to P-substrate junction at the trench interface due to the nature of the termination of the electric field through these layers to the trench. Identifying and measuring this component at different Vdd is necessary to make sure that this failure mode is not present in the actual operational voltage range of the final device product.

In accordance with the method of the invention, when the p-type region is reverse biased with respect to the N-type region, the bipolar component is suppressed. For example, when the "P" and "N" type region are both at Vdd, some internal IR drop in a more intrinsic deep collector region can turn on the parasitic emitter-base junction of a bipolar, and even at collector (P-substrate) voltage of 0 volts, a parasitic current will flow to the substrate. But when the "P" type region is reverse biased with respect to the "N" region, then this emitter-base junction is forced to be reverse biased. Therefore, the detected parasitic current at this bias is a purely FET component.

The method of the invention also helps to differentiate the long term leakage drift of the trench sidewall for different liner oxide thickness for the same amount extra trench. The fact that this trench bias is natural and not forced, makes it possible to differentiate between liner oxide thicknesses at regular bias conditions.

Thus, in view of the foregoing detailed description of the present invention, those skilled in the art will appreciate that the invention has applicability to any deep trench isolation technology to determine (1) the inversion threshold voltage of the parasitic sidewall MOSFET by using a sequence of different ratioed trench capacitors, (2) optimum trench liner oxide thickness for a given thermal budget without any electrical contact to the trench, (3) the punch through leakage onset around the layers of the deep trench, (4) dielectric sidewall quality (fixed charge, trapped charge) and sub-threshold slope detection of the parasitic MOSFET, (5) the hot carrier reliability of the deep trench isolation technology, and (6) the optimum ratio of epi thickness to well thickness with respect to the parasitic behavior of the deep trench structure.

It should be understood that the particular embodiments of the invention described above have been provided by way of example and that other modifications may occur to those skilled in the art without departing from the scope and spirit of the invention as express in the appended claims and their equivalents.

What is claimed is:

1. An electrical test structure for characterization of deep trench sidewall leakage current, the test structure comprising:
   a plurality of test structures formed in a P-type semiconductor substrate, each test structure including
   (i) an N-buried layer formed below an upper surface of the semiconductor substrate;
   (ii) a deep trench dielectric isolation structure that extends from an upper surface of the semiconductor substrate to intersect with the N-buried layer to define an electrically isolated active device region;
   (iii) an N-well formed in the active device region; and
   (iv) a P-type diffusion region formed in the N-well,
   and wherein, for each of the deep trench isolation structures formed in the semiconductor substrate, the area of the deep trench isolation structure is different than the area of each of the other deep trench isolation structures.

2. An electrical test structure as in claim 1, and wherein the deep trench isolation structure comprises liner oxide filled with polysilicon.

3. An electrical test structure as in claim 1, and wherein the deep trench isolation structure comprises silicon oxide.

4. An electrical test structure as in claim 1, and wherein each of the plurality of test structures includes a ground ring formed around and spaced apart from the deep trench dielectric isolation structure.

5. An electrical test structure as in claim 1, and wherein each of the plurality of test structures includes a Vdd guard ring formed around and spaced apart from the deep trench isolation structure.

6. A method of characterizing deep trench sidewall leakage current utilizing an electrical test structure that includes a plurality of test structures formed in a P-type semiconductor substrate, each test structure including (i) an N-buried layer formed below an upper surface of the semiconductor substrate, (ii) a deep trench dielectric isolation structure that extends from an upper surface of the semiconductor substrate to intersect with the N-buried layer to define an electrically isolated active device region, (iii) an N-well formed in the active device region, and (iv) a P-type diffusion region formed in the N-well, and wherein, for each of the deep trench isolation structures formed in the semiconductor substrate, the area of the deep trench isolation structure is different than the area of each of the other deep trench isolation structures, the method comprising:

for each electrical test structure formed in the semiconductor substrate,
(a) applying a bias voltage at the P-type diffusion region;
(b) applying the bias voltage to the N-well;
(c) applying a test voltage to the P-type semiconductor substrate;
(d) measuring the current at the P-type diffusion region;
(e) comparing the current measure at the P-type diffusion region for each test structure against a specified current limit; and
(f) selecting the test structure for which the current measured at the P-type diffusion region meets the specified current limit for incorporation into an integrated circuit design.

7. The method of claim 6, wherein each of the plurality of test structures includes a ground ring formed around and spaced apart from the deep trench isolation structure.

8. The method of claim 6, wherein each of the plurality of test structures includes a Vdd guard ring formed around and spaced apart from the deep trench isolation structure.

* * * * *